United States Patent [19]
Suh

[11] Patent Number: 6,069,089
[45] Date of Patent: May 30, 2000

[54] DEFECTIVE SEMICONDUCTOR REDISTRIBUTION LABELING SYSTEM

[76] Inventor: Hong C. Suh, #102-1801, Dongsung Apt., 501, Chookjun-li, Sooji-up, Yongin-si, Kyoungki-do, Rep. of Korea

[21] Appl. No.: 09/216,887

[22] Filed: Dec. 18, 1998

[51] Int. Cl.[7] .................................................. H01L 21/00
[52] U.S. Cl. ........................ 438/707; 148/33.2; 216/65; 216/84; 438/8; 438/14
[58] Field of Search ................................. 216/59, 60, 61, 216/65, 84, 85, 86; 438/8, 9, 14, 16, 707, 719, 745, 746, 753; 148/33, 33.2

[56] References Cited

U.S. PATENT DOCUMENTS

| | | | |
|---|---|---|---|
| 3,664,913 | 5/1972 | Ratcliff | 156/345 |
| 5,246,539 | 9/1993 | Canestrari et al. | 156/345 X |
| 5,814,528 | 9/1998 | Ju et al. | 438/692 X |
| 5,943,549 | 8/1999 | Motoura et al. | 216/85 X |
| 5,945,349 | 8/1999 | Koo | 216/85 X |

*Primary Examiner*—William Powell
*Attorney, Agent, or Firm*—Wolff & Samson

[57] ABSTRACT

A system for labeling defective semiconductor chips so that such defective chips can be used in secondary or downgraded applications is provided. The system includes identifying defective semiconductor chips which are not fit for their primary purpose. These defective semiconductor chips are labeled with a letter, symbol or other marking which indicates that they are defective. The marking may indicate the degree of defectiveness, or may include a code or other standard set forth by the industry. The label is etched or carved into the semiconductor generally at one or both ends, or at a center portion, using a laser or an engraver or other permanent labeling device. The etching or carving is of a depth which prevents one from knowingly or unknowingly erasing, removing or otherwise obliterating the label. An etching or carving depth of one half the thickness from the top surface of the chip has been found to be effective. Such a location and depth of the label is sufficient to prevent moisture from penetrating to the core of the chip. These labeled chips can then be sold at a reduced price to manufacturers as well as consumers. Because these defective semiconductor chips are properly labeled, they cannot be sold to unknowing manufacturers of electronic devices or consumers as regular (non-defective) semiconductor chips. In addition, by labeling defective semiconductor chips the manufacturer of the chips cannot accidentally sell a defective chip. This system captures the value that defective chips may have for secondary applications.

20 Claims, 1 Drawing Sheet

6,069,089

DEFECTIVE SEMICONDUCTOR REDISTRIBUTION LABELING SYSTEM

BACKGROUND OF THE INVENTION

1. Field of the Invention

This invention relates generally to a labeling system for marking and redistributing defective semiconductor devices (or chips). More specifically, the present invention provides a system for labeling defective semiconductor chips by carving or etching a symbol or code on the top surface of the defective chip and these labeled chips can then be offered for sale at a reduced price for secondary applications.

2. Related Art

Generally, in the semiconductor chip industry, manufactured chips are put through a quality control process. Defective chips are identified and generally discarded. This is the case despite the fact that a defective chip may have limited use for applications other than the intended application, e.g. in simple electronic devices or in applications downgraded from the original purpose of the chips. Presently, some manufacturers label defective chips with print marking. However, such markings can be erased (intentionally or unintentionally), removed or otherwise obliterated and the chip can then be sold as a regular (non-defective) chip at full price. If this occurs, a chip manufacturer's reputation could be tarnished. Accordingly, such a chip manufacturer would prefer to discard the defective chips to avoid the danger of future sales of the defective chips as regular chips.

Accordingly, what is needed, and has not heretofore been developed, is a method for permanently labeling defective chips so that such defective chips can be sold for use in simple electronic devices, or for downgraded applications, for which such chips are fit to use, but which prevents such defective chips from being sold as regular (non-defective) chips.

OBJECTS AND SUMMARY OF THE INVENTION

It is an object of the present invention to provide a system for labeling defective semiconductor chips for use in the industry as defective chips.

It is another object of the present invention to provide a system for labeling defective semiconductor chips according to the degree of defectiveness.

It is an additional object of the present invention to provide a system for labeling defective semiconductors according to a code created by the chip manufacturing industry.

It is even an additional object of the present invention to provide a system for labeling defective semiconductor chips with a label which cannot be erased, removed or otherwise obliterated.

It is yet another object of the present invention to provide a system for labeling defective semiconductor chips so that manufacturers can sell such defective semiconductor chips for use in applications other than the intended application, e.g. in simple electronic devices, or in applications downgraded from the original purpose of the chips.

It is another object of the present invention to provide a system for labeling defective semiconductor chips to prevent the necessity of the manufacturer of the chips to "destroy" such defective chips.

It is even an additional object of the present invention to provide a system for labeling defective semiconductor chips so that a user of semiconductor chips will not be able to unknowingly purchase defective chips.

It is yet another object of the present invention to provide a system for labeling defective semiconductor chips, wherein the label is permanent but does not allow moisture to penetrate into the core of the chip as a result of the labeling.

It is still another object of the present invention to provide a system for labeling defective semiconductor chips so that the manufacturer of these chips cannot unknowingly sell these defective chips.

It is also an object of the present invention to eliminate the need for destroying defective chips, which chips may have various applications other than those applications for which the chip was originally designed.

The present invention relates to a system for labeling defective semiconductor chips so that such defective chips can be used in secondary applications. The system includes identifying defective semiconductor chips which are not fit for their primary purpose. These defective semiconductor chips are labeled with a letter, symbol or other marking which indicates that they are defective. The marking may indicate the degree of defectiveness, or may include a code or other standard set forth by the industry. The label is etched or carved into the semiconductor generally at one or both ends, or even at the center, using a laser or an engraver or other permanent labeling device. The etching or carving is of a depth which prevents one from knowingly or unknowingly erasing, removing or otherwise obliterating the label. An etching or carving depth of one half the thickness from the top surface of the chip has been found to be effective. Such a location and depth of the label is sufficient to prevent moisture from penetrating to the core of the chip. These labeled chips can then be sold at a reduced price to manufacturers as well as consumers. Because these defective semiconductor chips are properly labeled, they cannot be sold to unknowing manufacturers of electronic devices or consumers as regular (non-defective) semiconductor chips. In addition, by labeling defective semiconductor chips the manufacturer of the chips cannot accidentally sell a defective chip. This system captures the value that defective chips may have for secondary or downgraded applications.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

The present invention relates to a system for labeling defective semiconductor chips so that such defective chips can be used in secondary or downgraded applications. After being labeled as defective chips, these chips can be resold at a reduced price for use in secondary or downgraded applications. This invention reduces risks to manufacturers that do not want to resell defective chips because the defective chips are labeled in such a way that the label cannot be removed, erased or otherwise obliterated, thereby alerting the purchaser that the chip is defective.

Figure 1:
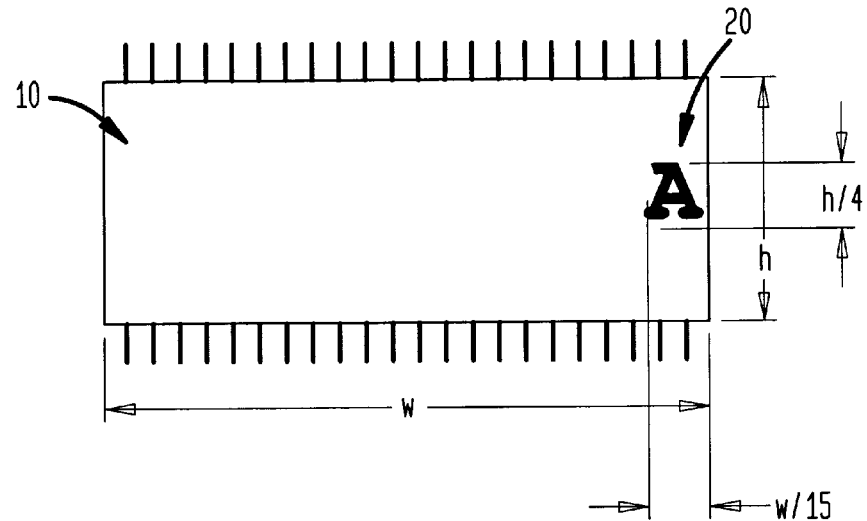
FIG. 1 is a top plan view of a semiconductor chip labeled defective according to the present invention, showing a preferred location of the label on the chip.

Referring to FIG. 1, a top view of a chip 10 is shown. As can be seen, the chip 10 contains a label 20. As shown in FIG. 1 the defective chip 10 is labeled with the letter A. Preferably, such a label is applied to one or both ends of the chip 10 and is of a size that can be easily seen, although the label can be applied at any other desirable location such as the center area of the chip. Ideally, the label 20 is positioned midway of the height H on the chip 10 and is sized to be one quarter of the total height of the chip 10 and one fifteenth of the total width of the chip 10.

Figure 2:
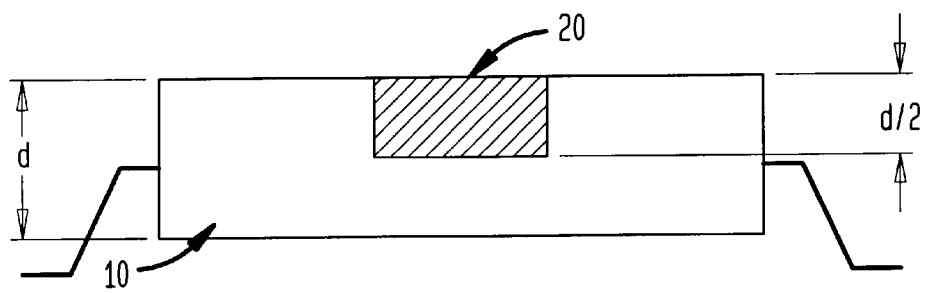
FIG. 2 is a cross-sectional view of a semiconductor chip of FIG. 1, which shows the depth of the carved or etched label with respect to the overall depth of the semiconductor chip.

Referring to FIG. 2, which shows a cross-sectional view of the chip of FIG. 1, the label 20 can be seen as being half the depth of the chip 10. Importantly, the size, position and depth of the label prevents the label from being removed, erased or otherwise obliterated. If one attempts to grind the chip down to obliterate the label 20, such a marking on the chip would be easily observed thereby it is unlikely that such a chip could be resold as a regular chip. Additionally, it should be noted that by positioning the label 20 on the chip 10 as described, the possibility of humidity penetration to the core 30 and/or electrical leads of the chip is minimized.

Figure 3:
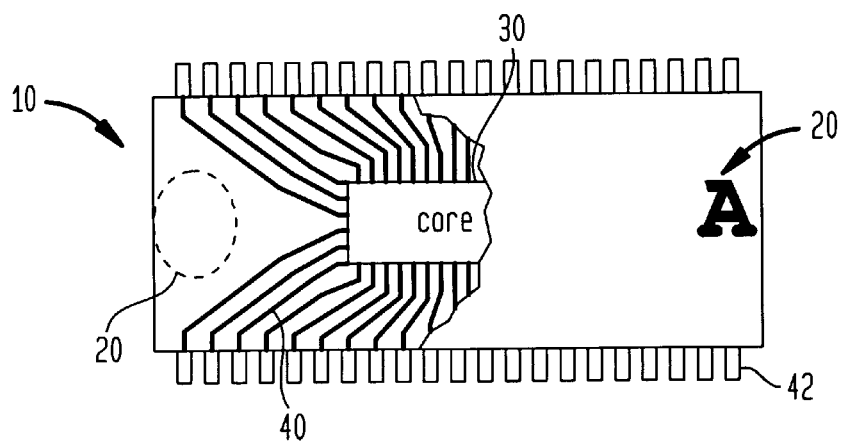
FIG. 3 is a top, partially cut away view of the chip of FIG. 1, labeled defective at both ends of the chip.

FIG. 3 shows a partially cut away view of the chip of FIG. 1 showing the position of the core 30 and the components of the chip. As can be seen, the label 20 is placed in position away from the core 30 of the chip and the electrical leads 40 which lead to pins 42. By positioning the label at the furthest location from the core 30, the core 30 is best protected. After the defective chip is labeled, it can be resold as a defective chip and reused in an alternate device that does not need the full requirements of the chip. Alternatively, if the label is to be etched at another location on the chip, such as at the center of the top surface of the chip, care must be taken to avoid etching too deep into the chip such that the core of the chip could be affected during etching or even thereafter, by moisture. Thus, if the chip is marked at a center portion thereof, it is desirable to make the depth of the etching much less than if marked at the ends.

It is very likely that such defective chips are more than adequate for use in relatively simple of electronic devices. Importantly, the level of defectiveness can be determined and the chips can be properly classified based on their degree of defectiveness and then labeled to indicate such. For example, there can be A-rated chips which are 10% defective, B-rated chips which are 20% defective, etc. This coding can be arranged as desired. Preferably, the chip manufacturers could agree on a standard for testing and identifying such chips based on the degree of defectiveness. These chips can then be redistributed to the market and sold less expensively than regular chips.

The chips can be etched in any manner known in the art. Clearly, the easiest, least expensive method is preferred. One way to label the chips is with a laser. The penetration depth of the laser depends on the intensity of the laser. Any laser marking machine can be utilized, and the procedure for adjusting the power and associated depth of the laser can be easily performed by an operator skilled in the operation of such a laser marking machine. Importantly, the depth of the labeling can be varied in accordance with the needs and desires of the user. The idea, as set forth above, is to prevent the label from being removed, erased or obliterated. Accordingly, the etched mark can be placed anywhere on the chip, although preferably it is placed at one or both ends of the chip.

Note that the position and depth of the labeling of the defective chip is very important. If the etching is not deep enough, there is the danger of it being erased. If the etching is too deep and close to the internal components in the semiconductor package (i.e. core 30 and electrical leads 40), there is the danger of moisture penetrating into the core 30 of the chip 10. Therefore, the etched label is preferably located at a point away from, and preferably a point which is furthest from, the internal materials within the package.

The present invention includes the method of collecting defective and consequently abandoned semiconductor chips and, after labeling the same according to the degree of defectiveness or manufacturing code, redistributing them into the market at a lower price. Etching the label will make erasing, removing or obliterating the label impossible, yet will not affect the chip's operational functions because there will be no moisture penetration. This invention will create a market for the abandoned defective chips and will be profitable for the manufacturers.

Having thus described the invention in detail, it is to be understood that the foregoing description is not intended to limit the spirit and scope thereof. What is desired to be protected by Letters Patent is set forth in the appended claims.

What is claimed is:

1. A method of redistributing defective semiconductor chips for use in secondary applications comprising:

identifying defective chips;

labeling the defective chip; and re-distributing the defective chip for use in a secondary application.

2. The method of claim 1 wherein the step of labeling the chip comprises etching an upper surface of the chip.

3. The method of claim 2 wherein the step of etching the upper surface of the chip at an end thereof.

4. The method of claim 3 wherein etching is performed at both of the ends of the upper surface of the chip.

5. The method of claim 2 wherein etching comprises laser etching.

6. The method of claim 5 wherein identifying a defective chip further comprises determining the relative defectiveness of the chip.

7. The method of claim 6 wherein the label identifies the degree of defectiveness of the chip.

8. The method of claim 5 wherein the depth of etching comprises approximately half of the depth of the chip.

9. A method of labeling defective semiconductor chips for use in secondary applications comprising:

identifying defective chips;

etching a label onto the top surface of the defective chip; and distributing the labeled, defective chip.

10. The method of claim 9 wherein the chip is labeled at an end of the top surface.

11. The method of claim 9 wherein the chip is labeled at both ends of the top surface.

12. The method of claim 9 wherein the label is etched by laser etching.

13. The method of claim 9 further comprising testing the defective chip to determine the degree of defectiveness.

14. The method of claim 13 wherein the degree of defectiveness is indicated by the label.

15. The method of claim 9 wherein the etching is a depth of approximately half the thickness of the chip.

16. A partially functioning semiconductor ship suitable for downgraded applications comprising:
   an upper surface; and
   a label etched into the upper surface of the chip to indicate that the chip is only partially functioning;
   wherein, the label indicates that the chip cannot be utilized for its intended purpose, but can be utilized in a downgraded application.

17. The chip of claim 16 wherein the label is etched at at least one end of the upper surface of the chip.

18. The chip of claim 17 wherein the label is etched at both ends of the upper surface of the chips.

19. The chip of claim 18 wherein the label identifies the degree to which the chip functions.

20. The chip of claim 18 wherein the label is etched to a depth of approximately one half the depth of the chip.

* * * * *